(12) United States Patent
Choi

(10) Patent No.: US 8,493,292 B2
(45) Date of Patent: Jul. 23, 2013

(54) ORGANIC LIGHT EMITTING DIODE DISPLAY AND MANUFACTURING METHOD THEREOF

(75) Inventor: Joon-Hoo Choi, Seoul (KR)

(73) Assignee: Samsung Display Co., Ltd. (KR)

(*) Notice: Subject to any disclaimer, the term of this patent is extended or adjusted under 35 U.S.C. 154(b) by 1176 days.

(21) Appl. No.: 11/621,738

(22) Filed: Jan. 10, 2007

(65) Prior Publication Data

US 2007/0159074 A1    Jul. 12, 2007

(30) Foreign Application Priority Data

Jan. 10, 2006  (KR) .................. 10-2006-0002700

(51) Int. Cl.
   *G09G 3/30*  (2006.01)
   *G09G 3/32*  (2006.01)
   *G09G 3/10*  (2006.01)

(52) U.S. Cl.
   USPC ............................ 345/76; 345/83; 315/169.3

(58) Field of Classification Search
   USPC .................. 345/76–83, 204–215, 690–699; 315/169.1–169.4
   See application file for complete search history.

(56) References Cited

U.S. PATENT DOCUMENTS

| | | | | |
|---|---|---|---|---|
| 5,818,070 | A * | 10/1998 | Yamazaki et al. | 257/72 |
| 6,198,133 | B1 * | 3/2001 | Yamazaki et al. | 257/347 |
| 6,245,602 | B1 | 6/2001 | Ho et al. | |
| 6,603,455 | B1 * | 8/2003 | Zhang et al. | 345/100 |
| 6,707,441 | B1 * | 3/2004 | Hebiguchi et al. | 345/92 |
| 7,122,969 | B2 * | 10/2006 | Fukumoto et al. | 315/169.3 |
| 7,532,187 | B2 * | 5/2009 | Afentakis et al. | 345/92 |
| 8,040,298 | B2 * | 10/2011 | Choi | 345/76 |
| 2002/0036724 | A1 * | 3/2002 | Ha | 349/38 |
| 2002/0044228 | A1 * | 4/2002 | Oh et al. | 349/40 |
| 2002/0125831 | A1 * | 9/2002 | Inukai et al. | 315/169.3 |
| 2003/0030381 | A1 * | 2/2003 | Yamazaki et al. | 315/169.1 |
| 2003/0142054 | A1 * | 7/2003 | Tada | 345/87 |
| 2004/0056828 | A1 * | 3/2004 | Choi et al. | 345/82 |
| 2005/0190133 | A1 * | 9/2005 | Kawachi | 345/87 |
| 2005/0200618 | A1 * | 9/2005 | Kim et al. | 345/204 |
| 2005/0227422 | A1 * | 10/2005 | Nakamura et al. | 438/166 |
| 2010/0289792 | A1 * | 11/2010 | Liao et al. | 345/213 |
| 2011/0122324 | A1 * | 5/2011 | Yamashita et al. | 348/739 |
| 2011/0273419 | A1 * | 11/2011 | Park et al. | 345/211 |

FOREIGN PATENT DOCUMENTS

| | | |
|---|---|---|
| JP | 2002-033481 | 1/2002 |
| JP | 2003-108034 | 4/2003 |
| JP | 2004-063717 | 2/2004 |
| JP | 2005-079283 | 3/2005 |
| JP | 2005-079549 | 3/2005 |

(Continued)

*Primary Examiner* — Alexander Eisen
*Assistant Examiner* — Patrick F Marinelli
(74) *Attorney, Agent, or Firm* — Cantor Colburn LLP

(57) ABSTRACT

An organic light emitting diode ("OLED") display includes a substrate; a gate line formed on the substrate; a secondary gate line substantially parallel to the gate line; a plurality of control electrodes each connected to one of the gate line and the secondary gate line; a data line intersecting the gate line and the secondary gate line; a switching thin film transistor ("TFT") connected to the gate line and the data line; a driving TFT connected to the switching TFT; a first electrode connected to the driving TFT; a second electrode facing the first electrode; and a light emitting member formed between the first electrode and the second electrode.

15 Claims, 15 Drawing Sheets

| | FOREIGN PATENT DOCUMENTS | |
|---|---|---|
| KR | 1997-0067912 | 10/1997 |
| KR | 1020020024466 | 3/2002 |
| KR | 1020020063524 | 8/2002 |
| KR | 1020030037877 | 5/2003 |
| KR | 1020030081992 | 10/2003 |
| KR | 1020040040241 | 5/2004 |
| KR | 1020040058454 | 7/2004 |
| KR | 1020050090666 | 9/2005 |

* cited by examiner

ORGANIC LIGHT EMITTING DIODE DISPLAY AND MANUFACTURING METHOD THEREOF

This application claims priority to Korean Patent Application No. 10-2006-0002700, filed on Jan. 10, 2006, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode ("OLED") display and a manufacturing method thereof.

(b) Description of the Related Art

Recent trends toward lightweight and thin personal computers and televisions sets accordingly require lightweight and thin display devices, and flat panel displays satisfying such a requirement are being substituted for conventional cathode ray tubes ("CRTs").

The flat panel displays include a liquid crystal display ("LCD"), a field emission display ("FED"), an organic light emitting diode ("OLED") display, a plasma display panel ("PDP"), among others. Among the flat panel displays, the OLED display is the most promising because of its low power consumption, fast response time, wide viewing angle and high contrast ratio.

An OLED display is a self-emissive display device which includes two electrodes and an organic light emitting layer interposed therebetween. One of the two electrodes injects holes and the other electrode injects electrons into the light emitting layer. The injected electrons and holes are combined to form exitons, which emit light as discharge energy.

The OLED displays may be divided into a passive matrix OLED display and an active matrix OLED display by a driving method thereof.

The passive matrix type OLED display includes a plurality of anode lines, a plurality of cathode lines intersecting the anode lines, and a plurality of pixels, each including a light emission layer. The selection of one of the anode lines and one of the cathode lines cause light emission of a pixel located at the intersection of the selected signal lines. In contrast, the active matrix type OLED display includes a plurality of pixels, each including a switching transistor, a driving transistor, and a storage capacitor as well as an anode, a cathode and a light emission layer. The driving transistor receives a data voltage from the switching transistor and drives a current having a magnitude determined by the data voltage. The current from the driving transistor enters the light emission layer to cause light emission having an intensity based on the driving current.

In the active matrix type OLED display, characteristics of the switching thin film transistor ("TFT") and those of the driving TFT may be different from each other to optimize the characteristics of the OLED. In more detail, the switching TFT may have a good on/off characteristic, and the driving TFT may have a high mobility and stability for supplying sufficient current for driving the OLED.

In the driving TFT, a polycrystalline semiconductor may be used for improving the field-effect mobility and stability of the driving TFT.

However, if the polycrystalline semiconductor is used in the switching TFT, then the on/off characteristic thereof may be deteriorated due to large leakage current of the polycrystalline semiconductor. Accordingly, the data voltage transported from the switching TFT to the driving TFT may be reduced to generate cross-talk.

BRIEF SUMMARY OF THE INVENTION

An orgnic light emitting diode ("OLED") display according to an exemplary embodiment of the present invention includes a substrate; a gate line formed on the substrate; a secondary gate line substantially parallel to the gate line; a plurality of control electrodes each connected to one of the gate line and the secondary gate line; a data line intersecting the gate line and the secondary gate line; a switching TFT connected to the gate line and the data line; a driving TFT connected to the switching thin film transistor ("TFT"); a first electrode connected to the driving TFT; a second electrode facing the first electrode; and a light emitting member formed between the first electrode and the second electrode.

The plurality of control electrodes may include a first control electrode connected to the gate line and a secondary control electrode connected to the secondary gate line.

The secondary control electrode may include a first secondary control electrode and a second secondary control electrode, and the first control electrode may be located between the first secondary control electrode and the second secondary control electrode.

At least one of the first secondary control electrode and the second secondary control electrode may overlap the first control electrode.

The secondary control electrode may be formed below the first control electrode.

The first control electrode and the secondary control electrode may be electrically insulated from each other.

The switching TFT may include a polycrystalline semiconductor.

The driving TFT may include a polycrystalline semiconductor.

The secondary gate line may be supplied with a voltage different from that of the gate line.

The secondary gate line may be floating when the gate line is supplied with a gate-off voltage.

The gate line and the secondary gate line may be formed on different layers from each other.

The OLED display may further include an input electrode connected to the data line, and an output electrode facing the input electrode. The input electrode and the output electrode may partially overlap the secondary control electrode.

The input electrode and the output electrode may be separated from the first control electrode.

An organic light emitting diode ("OLED") display according to another exemplary embodiment of the present invention includes a substrate; a secondary gate line formed on the substrate and including a secondary control electrode; a gate line electrically insulated from the secondary gate line and including a first control electrode; a first semiconductor partially overlapping the secondary control electrode and the first control electrode; a data line intersecting the gate line and the secondary gate line and including a first input electrode; a first output electrode facing the first input electrode; a second control electrode connected to the first output electrode; a second semiconductor formed on the second control electrode; a second input electrode and a second output electrode partially overlapping the second semiconductor; a first electrode connected to the second output electrode; a second electrode facing the first electrode; and a light emitting member formed between the first electrode and the second electrode.

The secondary control electrode may include a first secondary control electrode and a second secondary control electrode, and the first control electrode may be located between the first secondary control electrode and the second secondary control electrode.

The first semiconductor and the second semiconductor may include a polycrystalline semiconductor.

The OLED display may further include a first gate insulating layer formed between the secondary gate line and the gate line, and a second gate insulating layer formed between the gate line and the data line.

A method of manufacturing an organic light emitting diode ("OLED") display according to another exemplary embodiment of the present invention includes forming a secondary gate line including a secondary control electrode on the substrate; forming a first gate insulating layer on the secondary gate line and the substrate; forming a gate line including a first control electrode, and the second control electrode on the first gate insulating layer; forming a second gate insulating layer and a semiconductor layer on the gate line, the second control electrode, and the first gate insulating layer; crystallizing the semiconductor layer; forming data conductors including a data line including a first input electrode, a driving voltage line including a second input electrode, and a plurality of output electrodes on the crystallized semiconductor layer; forming a first electrode connected to one of the plurality of output electrodes; forming a light emitting member on the first electrode; and forming a second electrode on the light emitting member.

The crystallization of the semiconductor layer may be performed using solid phase crystallization.

An ohmic contact layer may be simultaneously formed on the semiconductor layer in the forming of the gate insulating layer and the semiconductor layer.

BRIEF DESCRIPTION OF THE DRAWINGS

The present invention will become more apparent by describing exemplary and preferred embodiments thereof in more detail with reference to the accompanying drawings, in which.

DETAILED DESCRIPTION OF THE INVENTION

Figure 1:
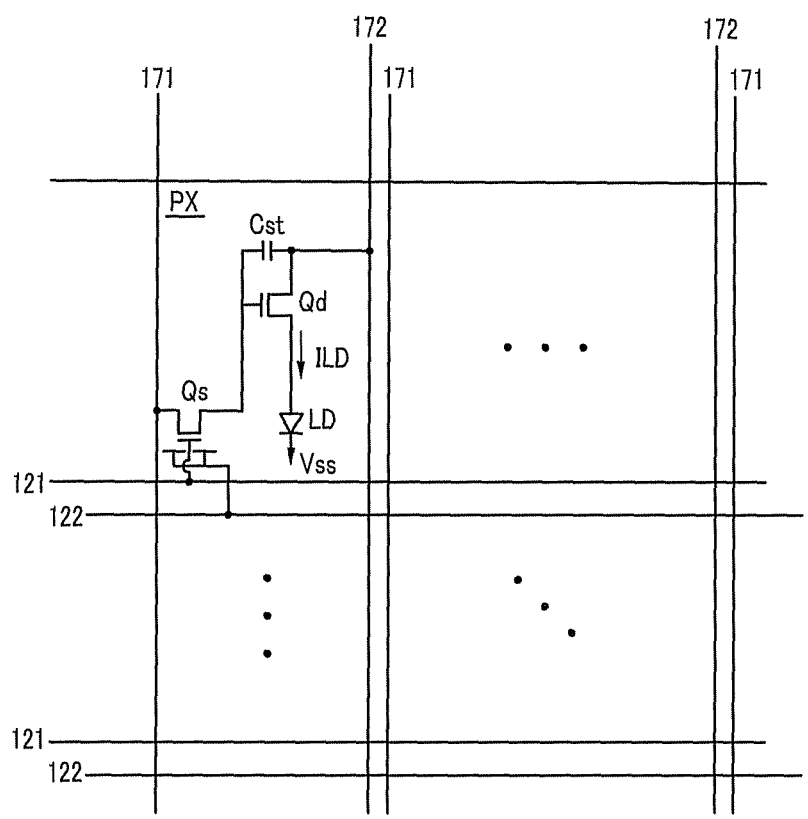
FIG. 1 an equivalent circuit schematic diagram of an OLED display according to an exemplary embodiment of the present invention.

The present invention will be described more fully hereinafter with reference to the accompanying drawings, in which exemplary embodiments of the invention are shown.

As those skilled in the art would realize, the described exemplary embodiments may be modified in various different ways, all without departing from the spirit or scope of the present invention. Rather, these exemplary embodiments are provided so that this disclosure will be thorough and complete, and will fully convey the scope of the present invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, an OLED display according to an exemplary embodiment of the present invention is described in more detail with reference to FIG. 1.

FIG. 1 is an equivalent circuit schematic diagram of an OLED display according to an exemplary embodiment of the present invention.

Referring to FIG. 1, an OLED display according to an exemplary embodiment of the present invention includes a plurality of signal lines 121, 122, 171 and 172, and a plurality of pixels PX connected thereto and arranged substantially in a matrix.

The signal lines include a plurality of gate lines 121 transmitting gate signals, a plurality of secondary gate lines 122 transmitting the same or different signals from the gate signals, a plurality of data lines 171 transmitting data signals, and a plurality of driving voltage lines 172 transmitting a driving voltage. The gate lines 121 and the secondary gate lines 122 extend substantially in a row direction and substantially parallel to each other, while the data lines 171 and the driving voltage lines 172 extend substantially in a column direction and substantially parallel to each other, as illustrated in FIG. 1.

Each pixel PX includes a switching transistor Qs, a driving transistor Qd and an organic light emitting diode ("OLED") LD.

The switching transistor Qs has plural control terminals, an input terminal and an output terminal. One of the control terminals is connected to the gate line 121, and the other control terminal is connected to the secondary gate line 122. The input terminal is connected to the data line 171, and the output terminal is connected to the driving transistor Qd. The switching transistor Qs transmits the data signals applied to the data line 171 to the driving transistor Qd in response to the gate signals applied to the gate lines 121, 122.

The driving transistor Qd has a control terminal connected to the output terminal of the switching transistor Qs, an input terminal connected to the driving voltage line 172, and an output terminal connected to the OLED LD. The driving transistor Qd drives an output current $I_{LD}$ having a magnitude depending on the voltage between the control terminal and the output terminal of the driving transistor Qd.

The capacitor Cst is connected between the control terminal and the output terminal of the driving transistor Qd. The capacitor Cst stores the data signal applied to the control terminal of the driving transistor Qd and maintains the data signal after the switching transistor Qs turns off.

The OLED LD has an anode connected to the output terminal of the driving transistor Qd and a cathode connected to a common voltage Vss. The OLED LD emits light having an intensity depending on an output current $I_{LD}$ of the driving transistor Qd, thereby displaying images.

The switching transistor Qs and the driving transistor Qd are n-channel field effect transistors ("FETs"). However, at least one of the switching transistor Qs and the driving transistor Qd may be a p-channel FET in alternative exemplary embodiments. In addition, the connections among the transistors Qs and Qd, the capacitor Cst, and the OLED LD may be modified.

A structure of the OLED display shown in FIG. 1 according to an exemplary embodiment of the present invention will be described in more detail with reference to FIGS. 2 and 3 along with FIG. 1.

Figure 2:
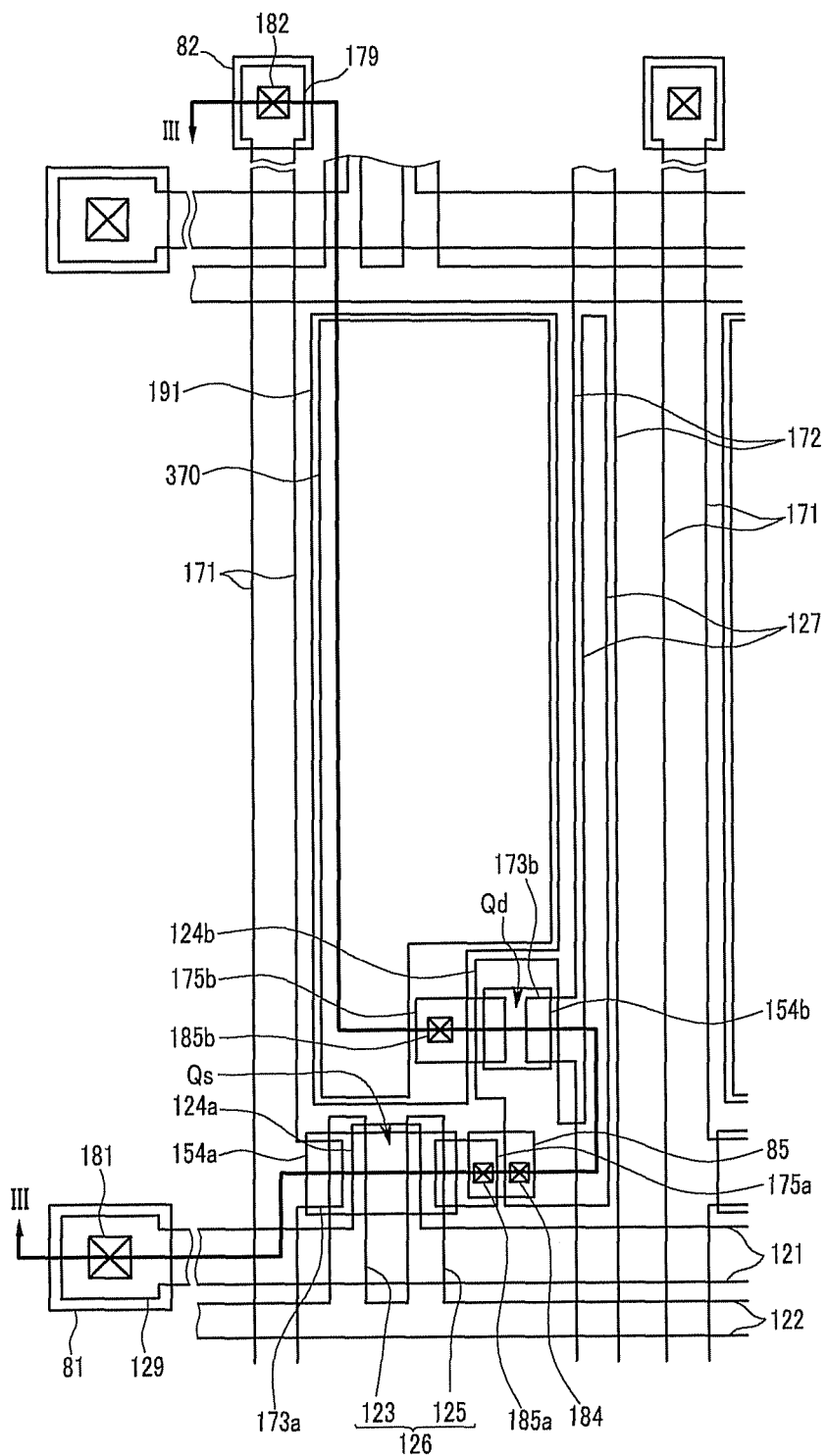
FIG. 2 is a plan view layout of an OLED display according to an exemplary embodiment of the present invention.

FIG. 2 is a plan view layout of an OLED display according to an exemplary embodiment of the present invention. FIG. 3 is a cross-sectional view of the OLED display shown in FIG. 2 taken along line III-III.

A plurality of secondary gate lines 122 including a plurality of secondary control electrodes 126 are formed on an insulating substrate 110 made of a material such as transparent glass or plastic, for example, but is not limited thereto.

The secondary gate lines 122 extend substantially in a transverse direction, as illustrated in FIG. 2. The secondary control electrodes 126 project upward from the secondary gate lines 122, and include a first secondary control electrode 123 and a second control electrode 125 separated from each other at a predetermined interval, as illustrated in FIG. 2.

In exemplary embodiments, the secondary gate lines 122 are made of an Al-containing metal such as Al or an Al alloy, an Ag-containing metal such as Ag or an Ag alloy, a Cu-containing metal such as Cu or a Cu alloy, a Mo-containing metal such as Mo or a Mo alloy, Cr, Ta, Ti, for example, but is not limited thereto. However, they may have a multi-layered structure including two films each having different physical characteristics.

The lateral sides of the secondary gate lines 122 are inclined relative to a surface of the substrate 110, and the inclination angle thereof is in a range of about 30 degrees to about 80 degrees.

In exemplary embodiments, a lower gate insulating layer 141 made of silicon nitride ("SiNx") or silicon oxide ("SiOx") is formed on the secondary gate lines 122.

The plurality of gate lines 121 including a plurality of first control electrodes 124a and a plurality of end portions 129, and a plurality of second control electrodes 124b are formed on the lower gate insulating layer 141.

The gate lines 121 transmit gate signals and extend substantially in a transverse direction, as illustrated in FIG. 2. Each gate line 121 further includes an end portion 129 having a large area for contact with another layer or an external driving circuit (not shown), and the first control electrode 124a projects upward from the gate line 121. Each of the first control electrodes 124a are located between a corresponding pair of secondary control electrodes 126 and partially overlap them, as illustrated in FIG. 3. The gate lines 121 may extend to be directly connected to a gate driving circuit (not shown) for generating the gate signals, which may be integrated on the substrate 110.

The second control electrodes 124b are separated from the gate lines 121 and the secondary gate lines 122. Each of the second control electrodes 124b includes a storage electrode 127 extending downward, turning to the right, and extending upward, as illustrated in FIG. 2.

The gate lines 121 and the second control electrodes 124b may be made of the same material as the secondary gate lines 122.

The lateral sides of the gate lines 121 and the second control electrodes 124b are inclined relative to a surface of the substrate 110, and the inclination angle thereof is in a range of about 30 degrees to about 80 degrees.

An upper gate insulating layer 142 preferably made of SiNx or SiOx is formed on the gate lines 121, the second control electrodes 124b and the lower gate insulating layer 141.

A plurality of first and second semiconductor islands 154a and 154b are formed on the upper gate insulating layer 142. The first and second semiconductor islands 154a and 154b may be made of a microcrystalline or polycrystalline semiconductor. Otherwise, one of the first semiconductor island 154a and the second semiconductor island 154b may be made of an amorphous semiconductor and the other may be made of a microcrystalline or polycrystalline semiconductor. The first semiconductor island 154a is located on the first control electrode 124a and the secondary control electrode 126, and the second semiconductor island 154b is located on the second control electrode 124b.

A plurality of pairs of first ohmic contact islands 163a and 165a and a plurality of pairs of second ohmic contact islands 163b and 165b are formed on the first and second semiconductor islands 154a and 154b, respectively. In exemplary embodiments, the ohmic contacts 163a, 163b, 165a and 165b are made of silicide or n+ hydrogenated a-Si heavily doped with an n-type impurity such as phosphorous.

A plurality of data conductors, which include a plurality of data lines 171, a plurality of driving voltage lines 172, and a plurality of first and second output electrodes 175a and 175b, are formed on the ohmic contacts 163a, 163b, 165a, and 165b and the upper gate insulating layer 142.

The data lines 171 for transmitting data signals extend substantially in the longitudinal direction and intersect the gate lines 121, as illustrated in FIG. 2. Each data line 171 includes a plurality of first input electrodes 173a extending toward the first secondary control electrodes 123 and an end portion 179 having a large area for contact with another layer or an external driving circuit (not shown). The data lines 171 may extend to be directly connected to a data driving circuit (not shown) for generating the data signals, which may be integrated on the substrate 110.

The driving voltage lines 172 for transmitting driving voltages also extend substantially in the longitudinal direction and intersect the gate lines 121, as illustrated in FIG. 2. Each driving voltage line 172 includes a plurality of second input electrodes 173b extending toward the second control electrodes 124b. The driving voltage lines 172 overlap the storage electrodes 127, as illustrated in FIG. 3.

The first and second output electrodes 175a and 175b are separated from each other and from the data lines 171 and the driving voltage lines 172. Each pair of the first input electrodes 173a and the first output electrodes 175a are disposed opposite each other with respect to a first control electrode 124a, and each pair of the second input electrodes 173b and the second output electrodes 175b are disposed opposite each other with respect to a second control electrode 124b.

The first input electrodes 173a and the first output electrodes 175a partially overlap the first secondary control electrodes 123 and the second secondary control electrodes 125, respectively, and they are separated from the first control electrodes 124a at a predetermined interval.

In exemplary embodiments, the data conductors 171, 172, 175a and 175b may be made of any refractory metal including Mo, Cr, Ta, Ti or alloys thereof. They may have a multi-layered structure including a refractory metal film and a low resistivity film, for example, but is not limited thereto.

Like the secondary gate lines 122, the gate lines 121, and the second control electrodes 124b, the data conductors 171, 172, 175a and 175b have inclined edge profiles, and the inclination angles thereof are in a range of about 30 degrees to about 80 degrees.

A passivation layer 180 is formed on the data conductors 171, 172, 175a and 175b, the exposed portions of the semiconductors 154a and 154b, and the upper gate insulating layer 142.

In exemplary embodiments, the passivation layer 180 is made of an inorganic insulator such as silicon nitride and silicon oxide, or an organic insulator such as a polyacrylic compound, and may have a flat surface. The passivation layer 180 may include a lower film of an inorganic insulator and an upper film of an organic insulator, for example, but is not limited thereto.

The passivation layer 180 has a plurality of contact holes 182, 185a and 185b exposing the end portions 179 of the data lines 171, and the first and second output electrodes 175a and 175b, respectively. The passivation layer 180 and the upper gate insulating layer 142 have a plurality of contact holes 181 and 184 exposing the end portions 129 of the gate lines 121 and the second input electrodes 124b, respectively.

A plurality of pixel electrodes 191, a plurality of connecting members 85, and a plurality of contact assistants 81 and 82 are formed on the passivation layer 180.

The pixel electrodes 191 are physically and electrically connected to the second output electrodes 175b through the contact holes 185b.

The connecting members 85 are connected to the second control electrodes 124b and the first output electrodes 175a through the contact holes 184 and 185a.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 from damage and complement the adhesion between the end portions 129 and 179 and external devices.

The pixel electrodes 191, the connecting members 85, and the contact assistants 81 and 82 may be made of a transparent conductor such as ITO or IZO, and they may be made of an opaque conductor such as Al or an alloy thereof, or Au, Pt, Ni, Cu, or W having a large work function or an alloy thereof in a top emission type display.

A partition 361 is formed on the pixel electrodes 191, the connecting members 85, and the passivation layer 180. The partition 361 surrounds the pixel electrodes 191 like a bank to define openings 365. The partition 361 may be made of an organic insulator, such as acrylic resin and polyimide resin, having heat-resistant and dissolvent properties, or an inorganic insulator, such as silicon dioxide ("$SiO_2$") or titanium dioxide ("$TiO_2$"), and may have a multi-layered structure. The partition 361 may be made of a photosensitive material containing black pigment so that the black partition 361 may serve as a light blocking member and the formation of the partition 361 may therefore be simplified.

A plurality of light emitting members 370 are formed on the pixel electrodes 191 and confined in the openings 365 defined by the partition 361.

Each of the light emitting members 370 may have a multi-layered structure including an emitting layer (not shown) for emitting light and auxiliary layers (not shown) for improving the efficiency of light emission of the emitting layer.

In exemplary embodiments, each of the light emitting members 370 is made of an organic material uniquely emitting one of primary color lights such as red, green, and blue light, for example, or a mixture of an organic material and an inorganic material, and may include a high molecular substance such as a polyfluorene derivative, a (poly)paraphenylenevinylene derivative, a polyphenylene derivative, a polyfluorene derivative, polyvinylcarbazole, a polythiophene derivative, or a compound doping an above high molecular substance with a perylene group pigment, a cumarine group pigment, a rhodamine group pigment, rubrene, perylene, 9,10-diphenylanthracene, tetraphenylbutadiene, Nile red, coumarin, quinacridone, etc.

The OLED display displays images by spatially adding the monochromatic primary color lights emitted from the light emitting members 370.

The auxiliary layers may include an electron transport layer (not shown) and a hole transport layer (not shown) for improving the balance of electrons and holes and an electron injecting layer (not shown) and a hole injecting layer (not shown) for improving the injection of the electrons and holes. The hole transport layer and the hole injecting layer may be made of a material having a work function which lies between that of the pixel electrodes 191 and that of the emission layer (not shown), and the electron transport layer and the electron injecting layer may be made of a material having a work function which lies between that of a common electrode 270 and that of the emission layer (not shown). For example, the hole transport layer and the hole injecting layer may be made of a compound such as poly-(3,4-ethylenedioxythiophene: polystyrenesulfonate (PEDOT:PSS).

The common electrode 270 is formed on the light emitting members 370 and the partition 361. The common electrode 270 is formed on the entire substrate 110, and supplies currents to the light emitting members 370 in cooperation with the pixel electrodes 191.

In the OLED display described above, the first control electrode 124a connected to the gate line 121, the first and second secondary control electrodes 123 and 125 connected to the secondary gate line 122, and the first input electrode 173a and the first output electrode 175a connected to the data line 171 along with the first semiconductor 154a form the switching TFT Qs having a channel formed on the first semiconductor 154a located between the first input electrode 173a and the first output electrode 175a.

Likewise, the second control electrode 124b connected to the first output electrode 175a, the second input electrode 173b connected to the driving voltage line 172, and the second output electrode 175b connected to the pixel electrode 191 along with the second semiconductor 154b form the driving TFT Qd having a channel formed on the second semiconductor 154b located between the second input electrode 173b and the second output electrode 175b.

As described above, the OLED display according to the present exemplary embodiment includes the switching TFT Qs including the first control electrodes 124a and the secondary control electrodes 126.

The first control electrode 124a is a main control electrode of the switching TFT Qs supplied with the gate voltages, and the secondary control electrode 126 is a secondary control electrode for reducing leakage current of the switching TFT Qs when the gate voltage is set to OFF gate voltage.

In more detail, when the gate voltage is set to ON, a positive voltage is supplied to the gate line 121 and a positive voltage is also supplied to the secondary gate line 122. Here, the data signal applied to the data line 171 is transmitted to the driving TFT Qd through the channel located over the first secondary control electrode 123, the first control electrode 124a and the second secondary control electrode 125. The gate line 121 and the secondary gate line 122 may be supplied with the same voltages, or alternatively, the secondary gate line 122 may be supplied with a slightly higher voltage to take into account a difference in the distance.

When the gate-off voltage is supplied to the gate line 121, the secondary gate line 122 is supplied with a positive or negative voltage which is different from the gate-off voltage. Here, the channel may not be formed over the first secondary control electrode 123 and the second secondary control electrode 125 located on both sides of the first control electrode 124a to form an offset region having a large resistance on the first secondary control electrode 123 and the second secondary control electrode 125. Accordingly, the electric charges (e.g., carriers) may not move in both lateral sides of the first control electrode 124a, as illustrated in FIG. 3, to reduce leakage current.

Although the secondary gate line 122 supplied with a positive or negative voltage which is different from the gate-off voltage while supplying the gate-off voltage is described in the above exemplary embodiment of the present invention, a floating secondary gate line 122 may also be applied in alternative exemplary embodiments.

Although the OLED display according to this exemplary embodiment includes a plurality of pixels PX including a switching TFT and a driving TFT, respectively, other TFTs and wiring for driving them may be included to prevent the driving TFT Qd from degrading and the lifetime of the OLED display from shortening.

A pixel electrode 191, a light emitting member 370 and the common electrode 270 form an OLED LD having the pixel electrode 191 as an anode and the common electrode 270 as a cathode, or vice versa. The overlapping portions of the storage electrode 127 and the driving voltage line 172 form a storage capacitor Cst.

Also, the control electrodes 124a and 124b may be formed on the semiconductor islands 154a and 154b, respectively, and the upper gate insulating layer 142 is located between the semiconductor islands 154a and 154b, and the control electrodes 124a and 124b. Here, the data conductors 171, 172, 173b and 175b may be located on the upper gate insulating layer 142, and are electrically connected to the semiconductors 154a and 154b through contact holes (not shown) formed in the upper gate insulating layer 142. Otherwise, the data conductors 171, 172, 173b and 175b may be located under the semiconductor islands 154a and 154b, and electrically connected to the semiconductor islands 154a and 154b disposed thereon.

Figure 3:
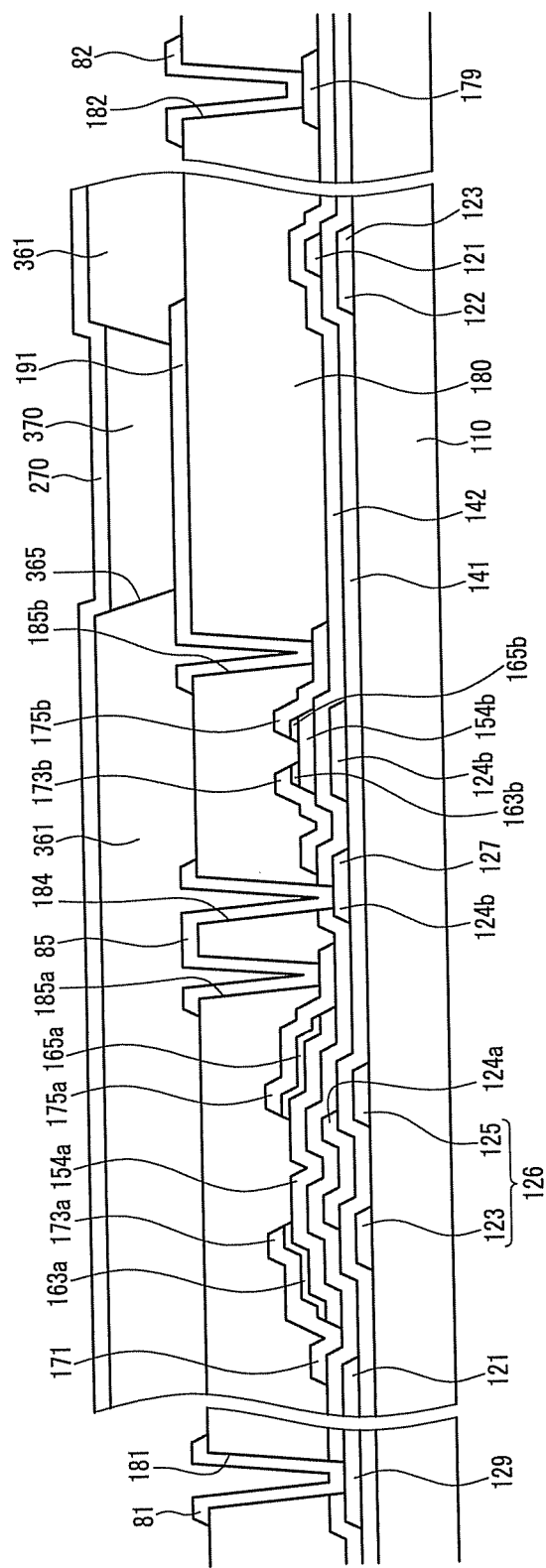
FIG. 3 is a cross-sectional view of the OLED display shown in FIG. 2 taken along line III-III.

Now, a manufacturing method of the OLED shown in FIGS. 2 and 3 is described with reference to FIGS. 4 to 15 along with FIGS. 2 and 3.

FIG. 4, FIG. 6, FIG. 8, FIG. 10, FIG. 12 and FIG. 14 are plan view layouts of the OLED display shown in FIGS. 2 and 3 in intermediate processes of a manufacturing method thereof according to an exemplary embodiment of the present invention. FIG. 5 is a cross-sectional view of the OLED display shown in FIG. 4 taken along line V-V. FIG. 7 is a cross-sectional view of the OLED display shown in FIG. 6 taken along line VII-VII. FIG. 9 is a cross-sectional view of the OLED display shown in FIG. 8 taken along line IX-IX. FIG. 11 is a cross-sectional view of the OLED display shown in FIG. 10 taken along line XI-XI. FIG. 13 is a cross-sectional view of the OLED display shown in FIG. 12 taken along line XIII-XIII. FIG. 15 is a cross-sectional view of the OLED display shown in FIG. 14 taken along line XV-XV.

Figure 4:
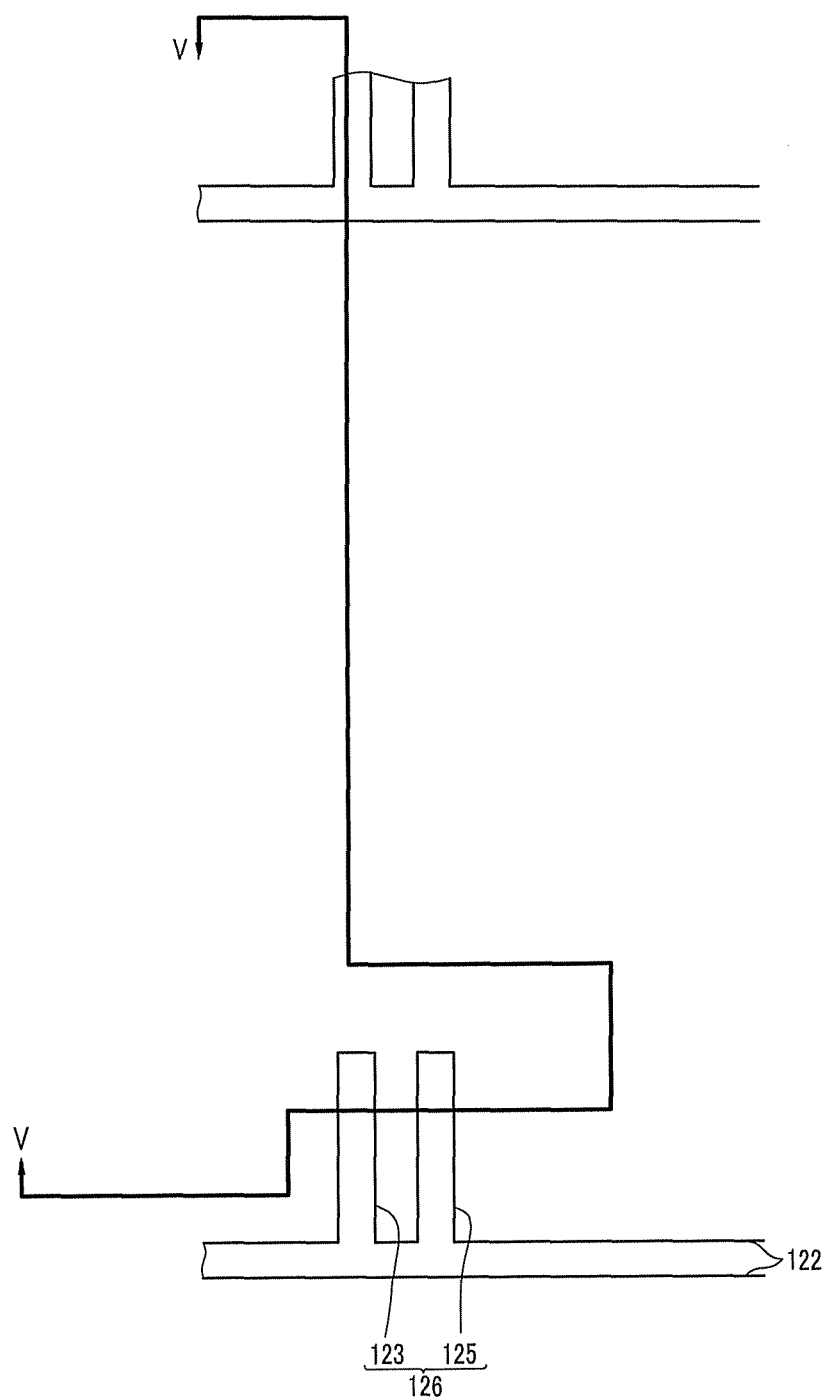
FIG. 4, FIG. 6, FIG. 8, FIG. 10, FIG. 12, and FIG. 14 are plan view layouts of the OLED display shown in FIGS. 2 and 3 in intermediate steps of a manufacturing method thereof according to an exemplary embodiment of the present invention.
Figure 5:
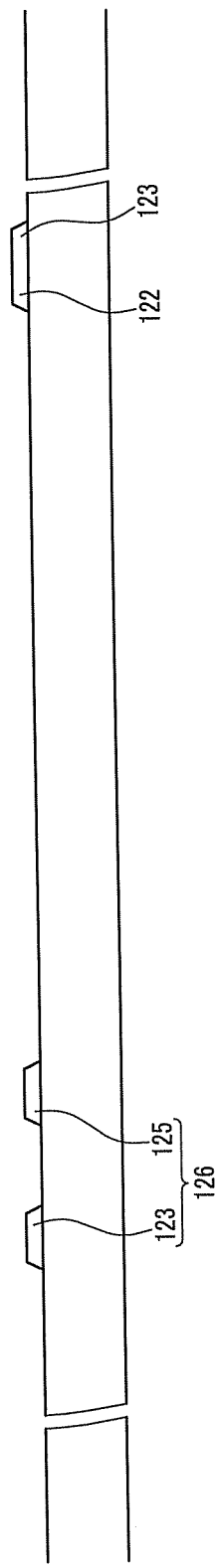
FIG. 5 is a cross-sectional view of the OLED display shown in FIG. 4 taken along line V-V.

As shown in FIGS. 4 and 5, a plurality of secondary gate lines 122 including a plurality of secondary control electrodes 126 having a plurality of first and second secondary control electrodes 123 and 125 are formed on an insulating substrate 110 made of a material such as transparent glass or plastic, for example, but is not limited thereto.

Figure 6:
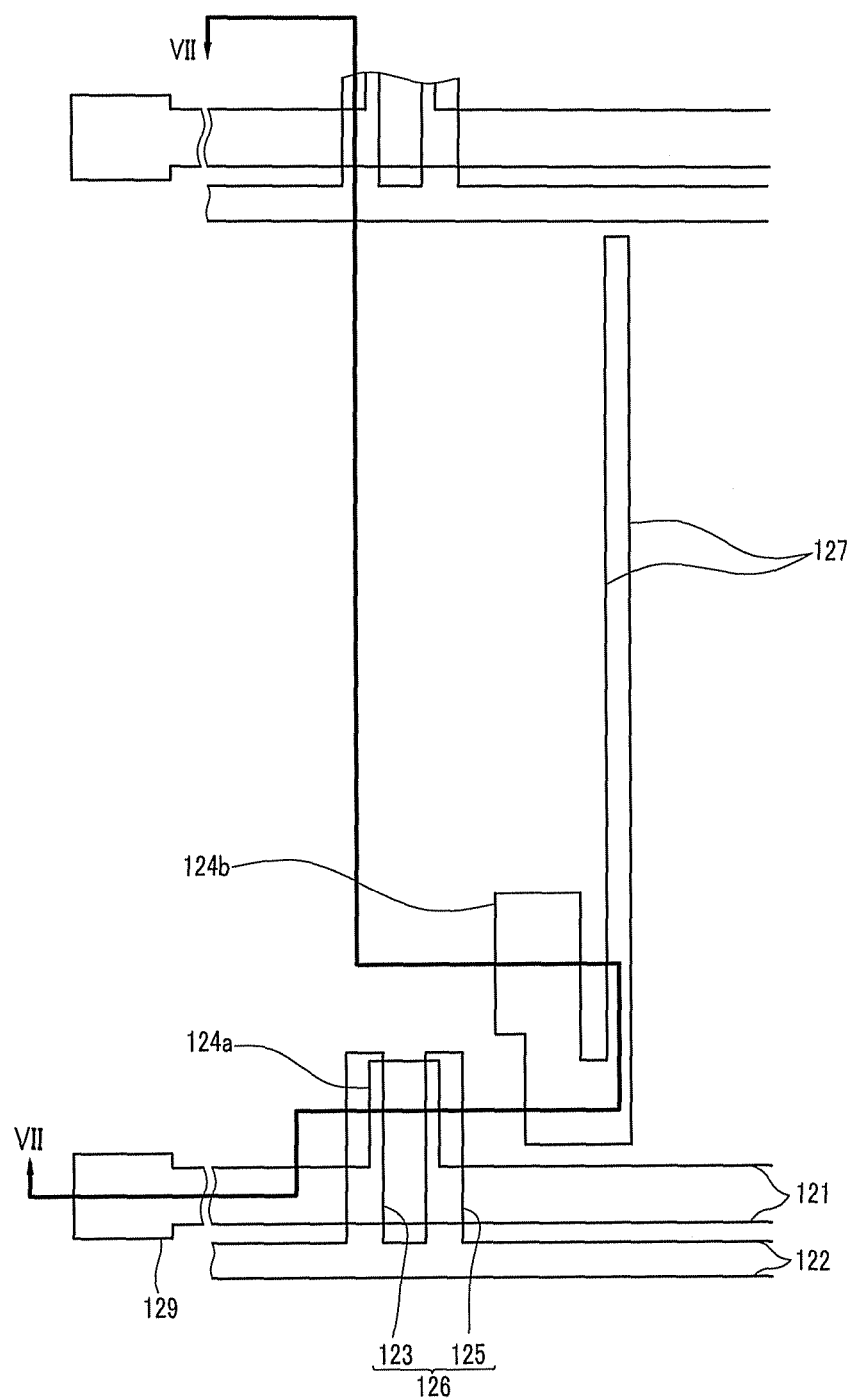
Figure 7:
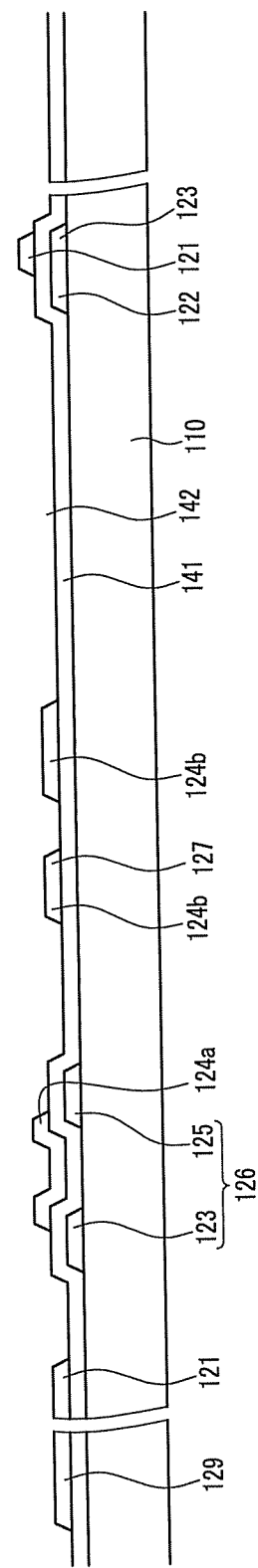
FIG. 7 is a cross-sectional view of the OLED display shown in FIG. 6 taken along line VII-VII.

Next, a lower gate insulating layer 141 is deposited on the substrate 110 having the secondary gate lines 122 by plasma enhanced chemical vapor deposition ("PECVD") as shown in FIGS. 6 and 7.

A plurality of gate lines 121 including a plurality of first control electrodes 124a and end portions 129, and a plurality of second control electrodes 124b including a plurality of storage electrodes 127 are formed on the lower gate insulating layer 141. Here, the first control electrodes 124a are located between the first and second secondary control electrodes 123 and 125, and partially overlap the first and second secondary control electrodes 123 and 125.

Figure 8:
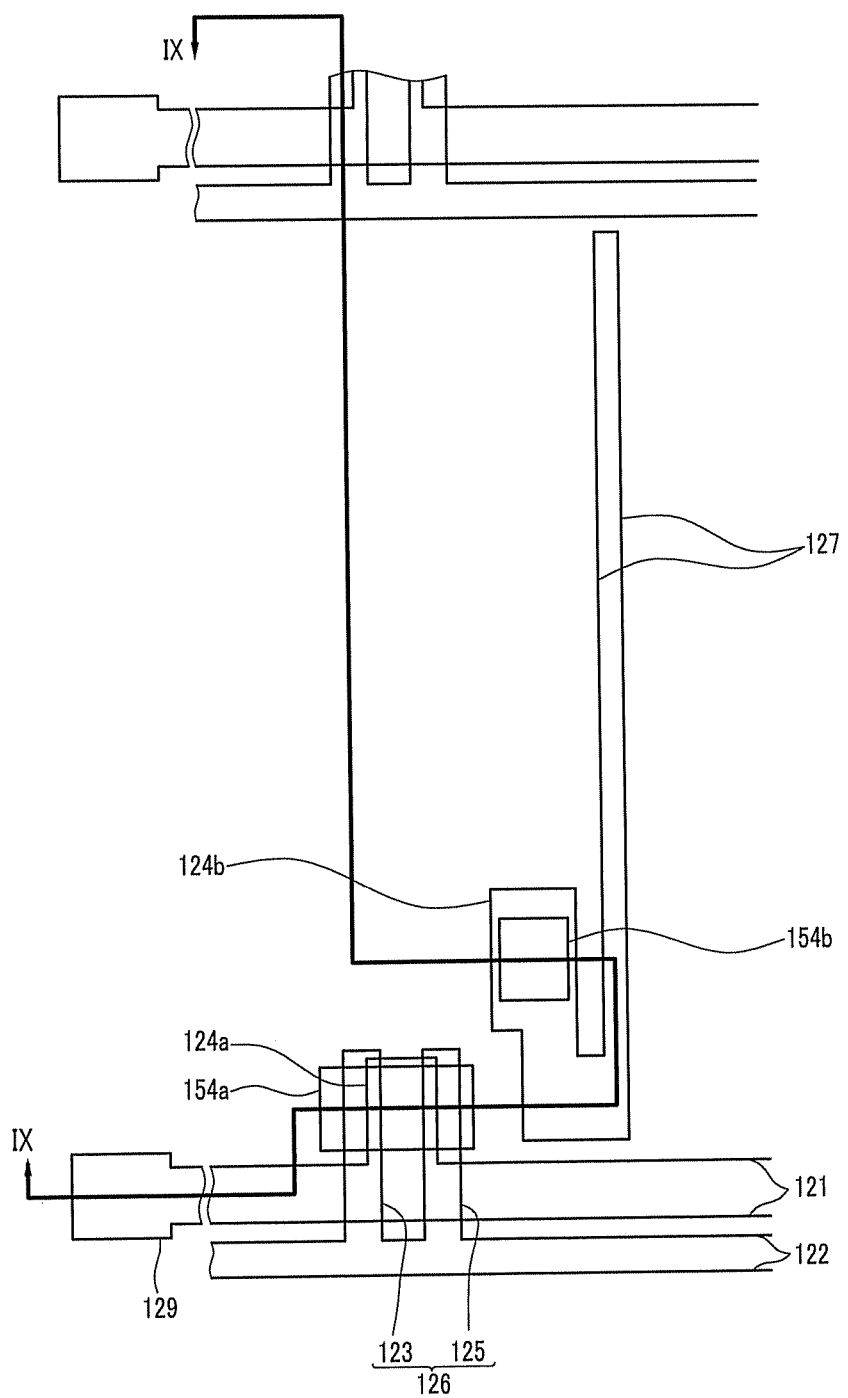
Figure 9:
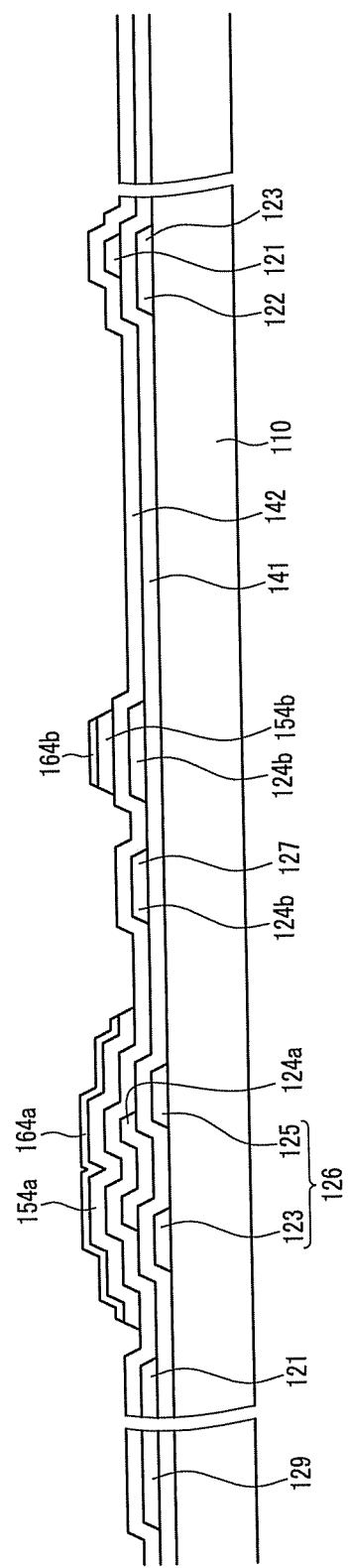
FIG. 9 is a cross-sectional view of the OLED display shown in FIG. 8 taken along line IX-IX.

Referring to FIGS. 8 and 9, after sequential deposition of an upper gate insulating layer 142, an intrinsic a-Si layer and an extrinsic a-Si layer are formed on the substrate 110 by PECVD, for example, but is not limited thereto, and then the extrinsic a-Si layer and the intrinsic a-Si layer are patterned by lithography and etching to form a plurality of extrinsic semiconductor layers 164a and 164b, and a plurality of first and second semiconductor islands 154a and 154b.

Thereafter, the first and second semiconductor islands 154a and 154b, and the extrinsic semiconductor layers 164a and 164b are crystallized. Here, the crystallization may be performed by solid phase crystallization ("SPC"), excimer laser annealing ("ELA"), metal induced lateral crystallization ("MILC"), or other similar crystallization processes. In exemplary embodiments, the SPC is used.

The crystallization may be performed after forming the first and second semiconductors 154a and 154b and before forming the extrinsic semiconductor layers 164a and 164b, and may be performed after deposition of the intrinsic a-Si layer and an extrinsic a-Si layer before patterning to form the first and second semiconductor islands 154a and 154b and the extrinsic semiconductor layers 164a and 164b.

Figure 10:
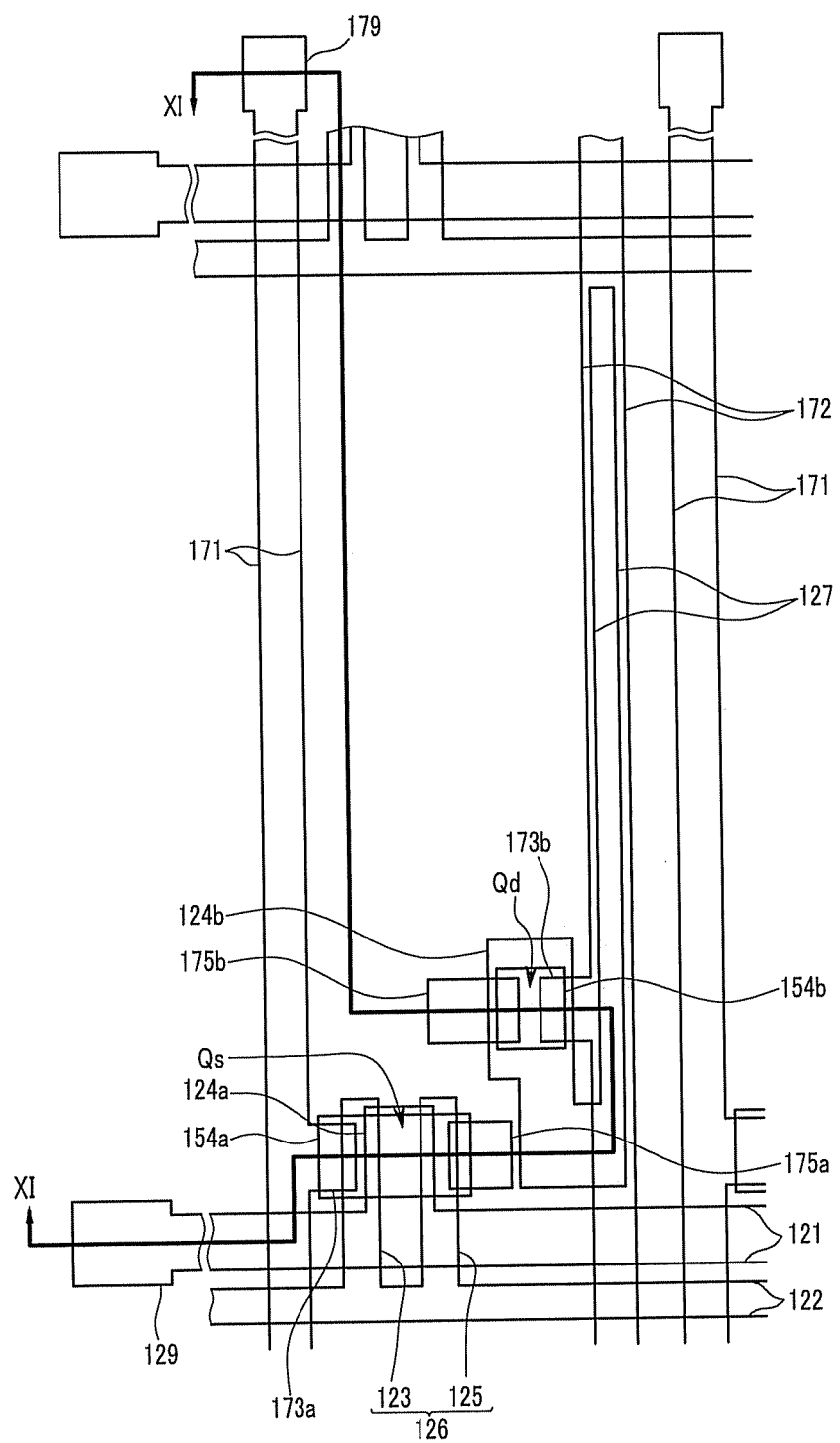
Figure 11:
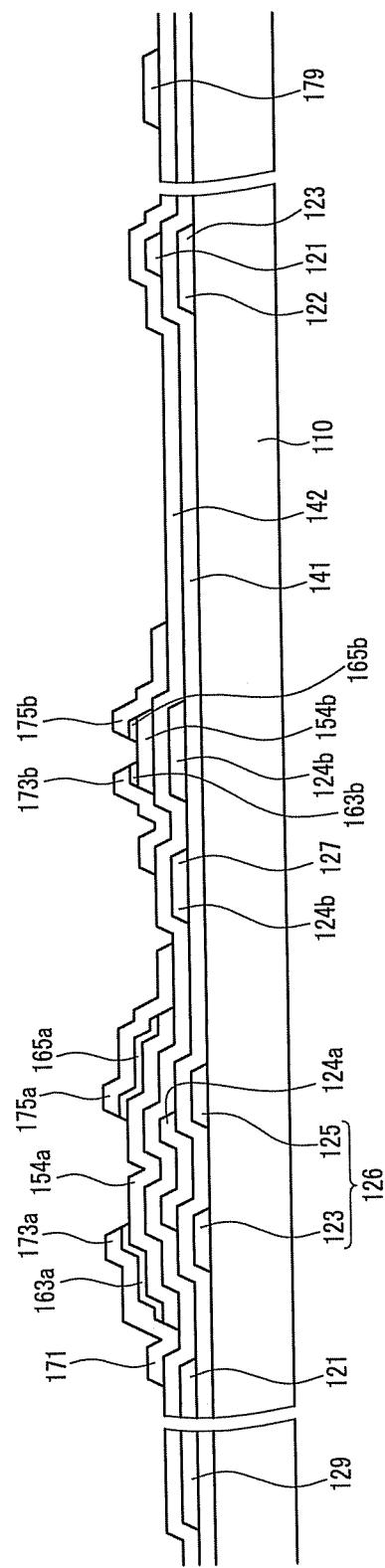
FIG. 11 is a sectional view of the OLED display shown in FIG. 10 taken along the line XI-XI.

As shown in FIGS. 10 and 11, data conductors, which include a plurality of data lines 171 including the first input electrodes 173a and end portions 179, a plurality of driving voltage lines 172 including a plurality of second input electrodes 173b, and a plurality of first and second output electrodes 175a and 175b, are formed on the extrinsic semiconductor layers 164a and 164b and the upper gate insulating layer 142.

Thereafter, portions of the extrinsic semiconductor layers 164a and 164b, which are not covered with the data conductors 171, 172, 175a and 175b are removed by etching to complete a plurality of ohmic contacts 163a, 165a, 163b and 165b and to expose portions of the underlying first and second semiconductor islands 154a and 154b.

Figure 12:
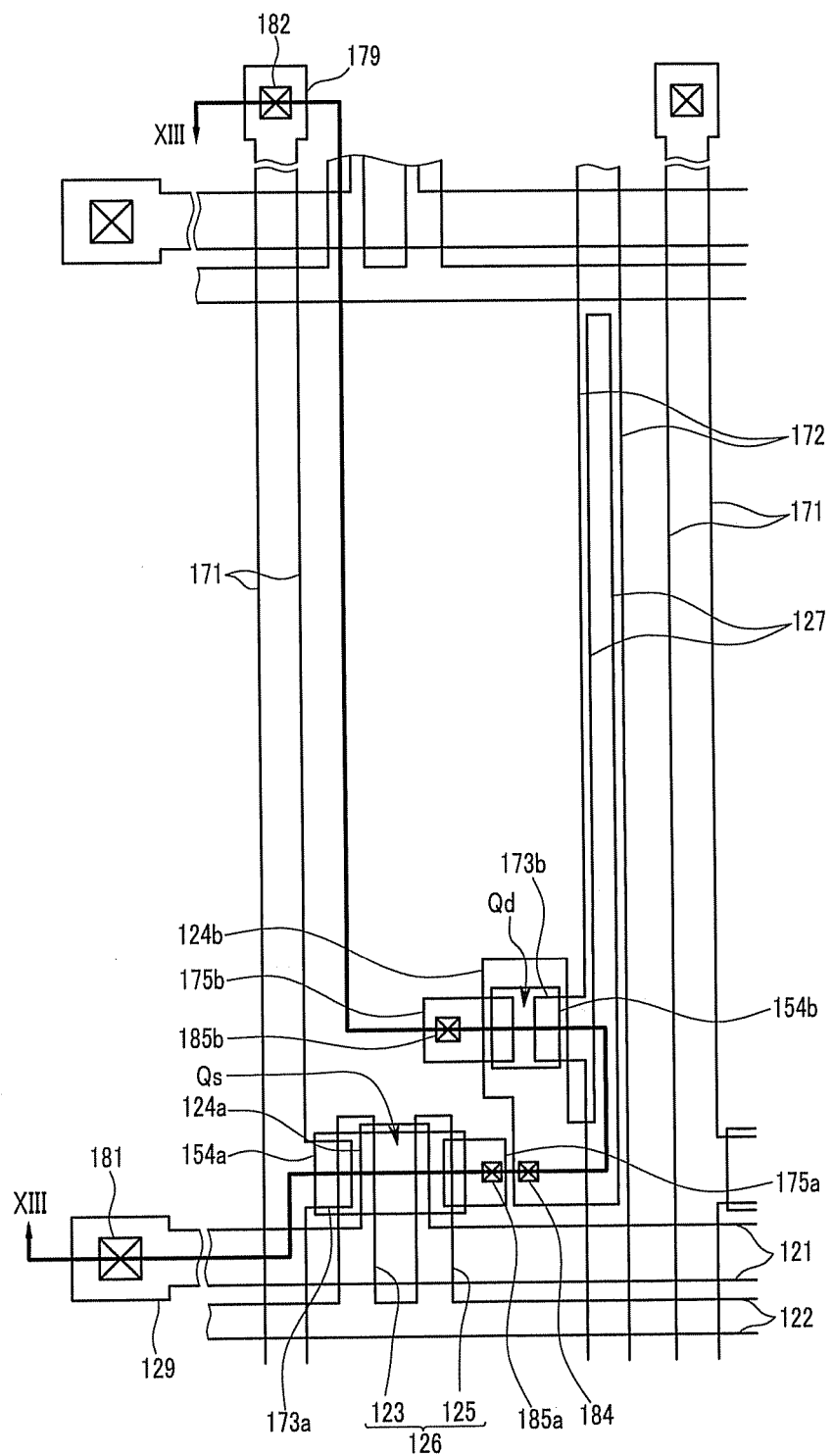
Figure 13:
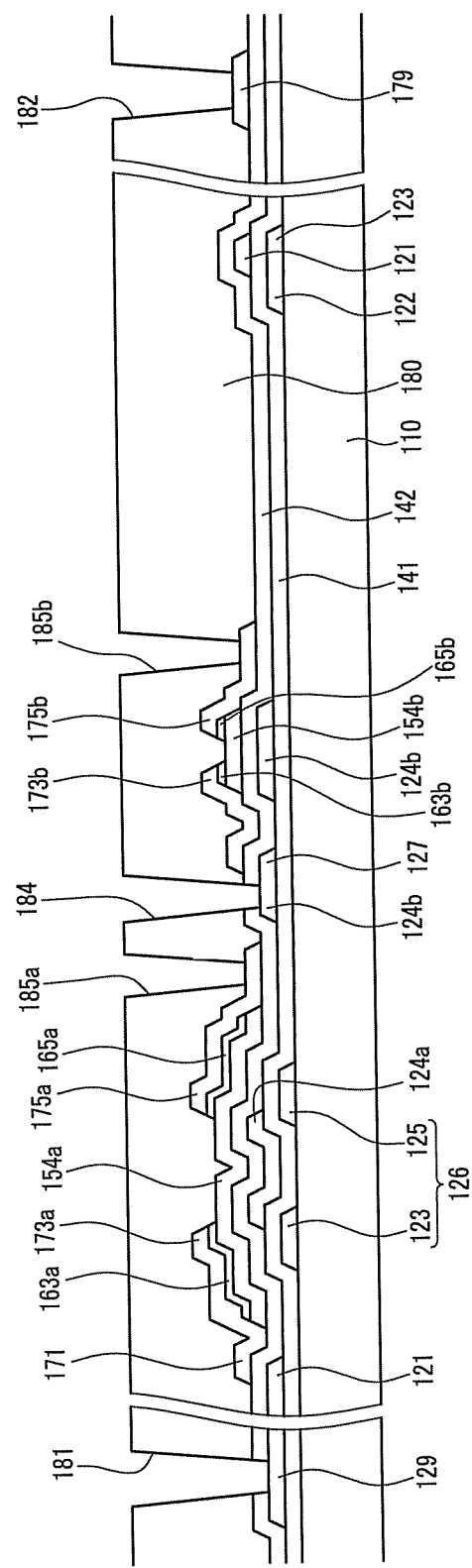
FIG. 13 is a cross-sectional view of the OLED display shown in FIG. 12 taken along line XIII-XIII.

Referring to FIGS. 12 and 13, a passivation layer 180 is deposited and patterned by photolithography (and etching) along with the upper gate insulating layer 142 to form a plurality of contact holes 181, 182, 184, 185a and 185b exposing the end portions 129 of the gate lines 121, the end portions 179 of the data lines 171, the second control electrodes 124b, the first output electrodes 175a, and the second output electrodes 175b, respectively.

Figure 14:
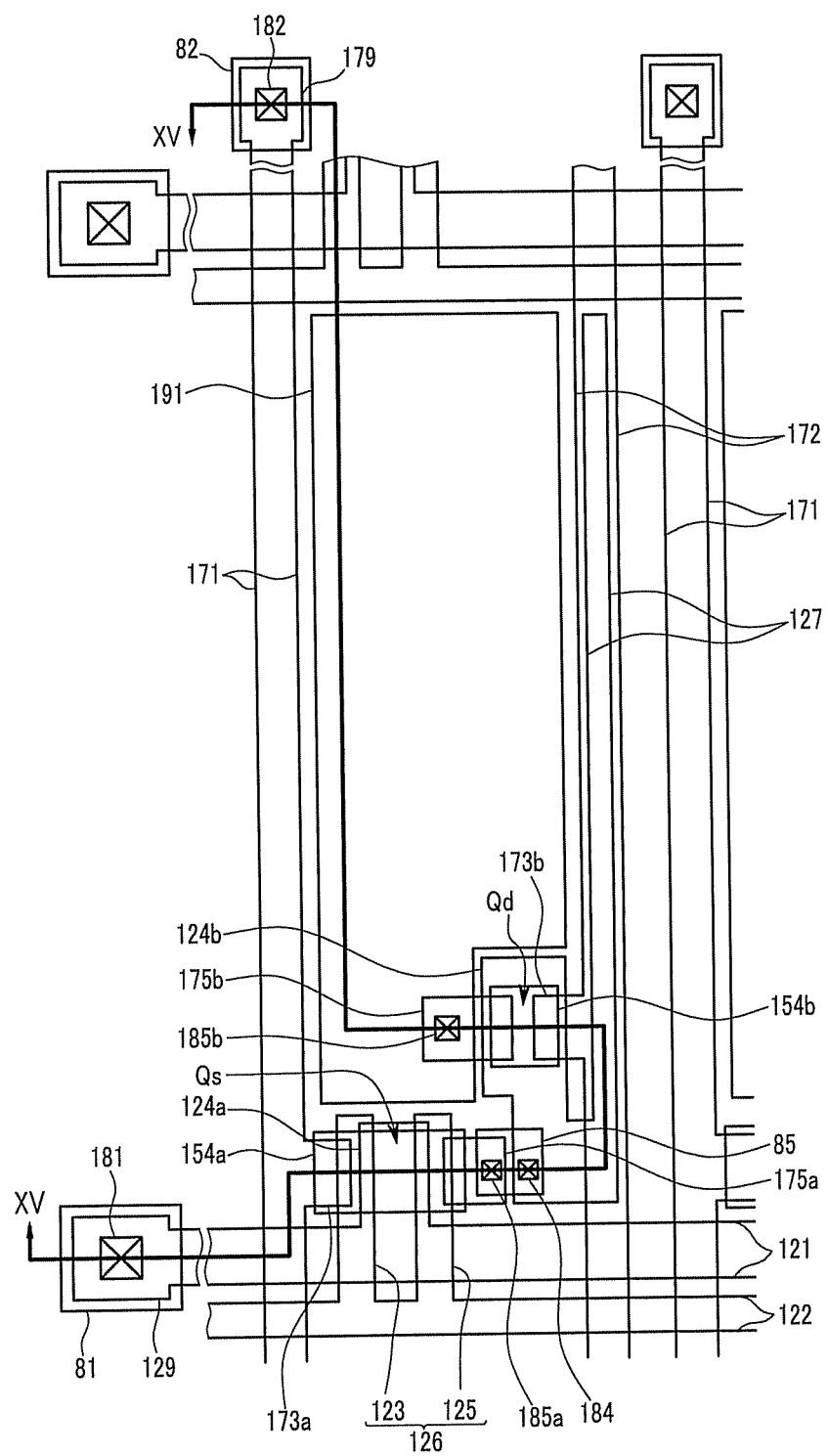
Figure 15:
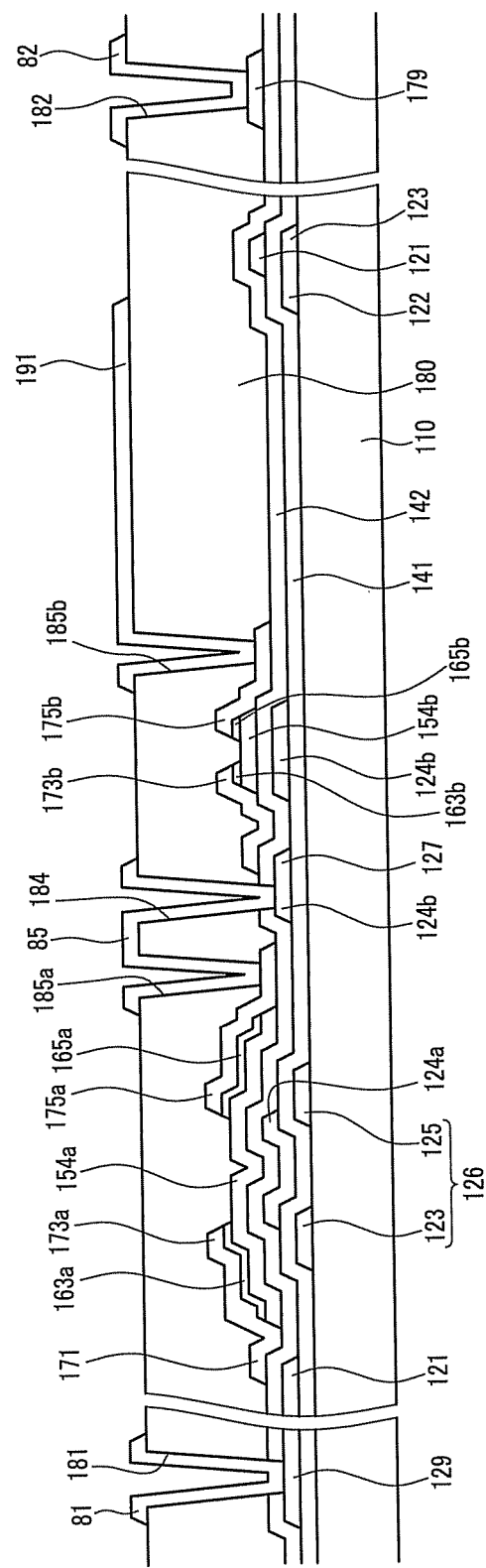
FIG. 15 is a cross-sectional view of the OLED display shown in FIG. 14 taken along line XV-XV.

A plurality of pixel electrodes 191, a plurality of connecting members 85, and a plurality of contact assistants 81 and 82 are formed on the passivation layer 180 as shown in FIGS. 14 and 15.

A photosensitive organic insulator is deposited by spin coating, and exposed and developed to form partition 361 having openings 365 as shown in FIGS. 2 and 3.

Thereafter, light emitting members 370 including a hole transport layer (not shown), and an emission layer (not shown) are formed in the openings 365 disposed on the pixel electrode 191. The organic light emitting members 370 may be formed by a solution process such as inkjet printing and evaporation, for example, but is not limited thereto.

Thereafter, a common electrode 270 is formed on the partition 361 and the light emitting members 370.

As described above, the OLED display according to an exemplary embodiment of the present invention includes a switching TFT including a polycrystalline semiconductor to reduce leakage current and improve characteristics of the OLED display.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. An organic light emitting diode display, comprising:
a substrate;
a gate line formed on the substrate;
a secondary gate line substantially parallel to the gate line;
a plurality of control electrodes each connected to one of the gate line and the secondary gate line;
a data line intersecting the gate line and the secondary gate line;
a switching thin film transistor (TFT) connected to the gate line and the data line, the switching TFT comprising the plurality of control electrodes, which include a first control electrode connected to the gate line and a secondary control electrode connected to the secondary gate line;
a driving TFT connected to the switching TFT;
a first electrode connected to the driving TFT;
a second electrode facing the first electrode; and
a light emitting member formed between the first electrode and the second electrode,
wherein the gate line and the secondary gate line are formed on different layers from each other and are electrically separated from each other,
wherein the secondary control electrode includes a first secondary control electrode and a second secondary control electrode, and
wherein the first control electrode is located between the first secondary control electrode and the second secondary control electrode and partially overlaps them.

2. The organic light emitting diode display of claim 1, wherein the secondary control electrode is formed below the first control electrode.

3. The organic light emitting diode display of claim 1, wherein the first control electrode and the secondary control electrode are electrically insulated from each other.

4. The organic light emitting diode display of claim 1, wherein the switching TFT includes a polycrystalline semiconductor.

5. The organic light emitting diode display of claim 1, wherein the driving TFT includes a polycrystalline semiconductor.

6. The organic light emitting diode display of claim 1, wherein the secondary gate line is supplied with a voltage different from that of the gate line.

7. The organic light emitting diode display of claim 1, wherein the secondary gate line is floating when the gate line is supplied with a gate-off voltage.

8. The organic light emitting diode display of claim 1, further comprising:
an input electrode connected to the data line and an output electrode facing the input electrode,
wherein the input electrode and the output electrode partially overlap the secondary control electrode.

9. The organic light emitting diode display of claim 8, wherein the input electrode and the output electrode are separated from the first control electrode.

10. An organic light emitting diode display, comprising:
a substrate;
a gate line formed on the substrate and including a first control electrode;

a secondary gate line electrically insulated from the gate line and including a secondary control electrode;

a first semiconductor partially overlapping the secondary control electrode and the first control electrode;

a data line intersecting the gate line and the secondary gate line and including a first input electrode;

a first output electrode facing the first input electrode;

a second control electrode connected to the first output electrode;

a second semiconductor formed on the second control electrode;

a second input electrode and a second output electrode partially overlapping the second semiconductor;

a first electrode connected to the second output electrode;

a second electrode spaced apart from and facing the first electrode relative to the substrate; and a light emitting member formed between the first electrode and the second electrode, wherein the gate line and the secondary gate line are formed on different layers from each other and are electrically insulated from each other, wherein the first control electrode and the secondary control electrode are formed on different layers from each other and partially overlap each other, and wherein the first control electrode, the secondary control electrode, the first semiconductor, the first input electrode, and the first output electrode form one thin film transistor, wherein the secondary control electrode includes a first secondary control electrode and a second secondary control electrode, and wherein the first control electrode is located between the first secondary control electrode and the second secondary control electrode and partially overlaps them.

11. The organic light emitting diode display of claim 10, wherein the first semiconductor and the second semiconductor include a polycrystalline semiconductor.

12. The organic light emitting diode display of claim 10, further comprising:

a first gate insulating layer formed between the secondary gate line and the gate line; and a second gate insulating layer formed between the gate line and the data line.

13. A method of manufacturing an organic light emitting diode display, comprising:

forming a secondary gate line including a secondary control electrode on a substrate;

forming a first gate insulating layer on the secondary gate line and the substrate;

forming a gate line including a first control electrode, and the second control electrode on the first gate insulating layer;

forming a second gate insulating layer and a semiconductor layer on the gate line, the second control electrode and the first gate insulating layer;

crystallizing the semiconductor layer;

forming data conductors including a data line including a first input electrode, a driving voltage line including a second input electrode and a plurality of output electrodes on the crystallized semiconductor layer;

forming a first electrode connected to one of the plurality of output electrodes;

forming a light emitting member on the first electrode; and forming a second electrode on the light emitting member, wherein the first control electrode and the secondary control electrode are formed on different layers from each other and partially overlap each other, wherein the gate line and the secondary gate line are formed on different layers from each other and are electrically separated from each other, wherein the first control electrode, the secondary control electrode, the first semiconductor, the first input electrode, and the first output electrode form one thin film transistor, wherein the secondary control electrode includes a first secondary control electrode and a second secondary control electrode, wherein the first control electrode is located between the first secondary control electrode and the second secondary control electrode and partially overlaps them.

14. The method of claim 13, wherein the crystallization of the semiconductor layer is performed using solid phase crystallization.

15. The method of claim 13, wherein an ohmic contact layer is simultaneously formed on the semiconductor layer in the forming of the second gate insulating layer and the semiconductor layer.

* * * * *